United States Patent [19]
Hayashi et al.

[11] Patent Number: 5,788,763
[45] Date of Patent: Aug. 4, 1998

[54] MANUFACTURING METHOD OF A SILICON WAFER HAVING A CONTROLLED BMD CONCENTRATION

[75] Inventors: Kenro Hayashi; Ryuji Takeda; Katsuhiro Chaki; Ping Xin; Jun Yoshikawa; Hiroyuki Saito, all of Kanagawa, Japan

[73] Assignee: Toshiba Ceramics Co., Ltd., Tokyo, Japan

[21] Appl. No.: 612,214

[22] Filed: Mar. 7, 1996

[30] Foreign Application Priority Data

| Mar. 9, 1995 | [JP] | Japan | 7-077093 |
| Mar. 17, 1995 | [JP] | Japan | 7-084524 |
| Jun. 28, 1995 | [JP] | Japan | 7-183250 |

[51] Int. Cl.$^6$ ............................................. C30B 25/02
[52] U.S. Cl. ................... 117/2; 117/4; 117/20; 117/932; 438/146; 438/147
[58] Field of Search ........................ 117/2, 4, 5, 20, 117/932; 437/12, 13; 438/146, 147

[56] References Cited

U.S. PATENT DOCUMENTS

| 4,597,804 | 7/1986 | Imaoka | 437/31 |
| 5,403,406 | 4/1995 | Falster et al. | 437/12 |
| 5,534,294 | 7/1996 | Kubota et al. | 437/12 |
| 5,593,494 | 1/1997 | Falster | 117/20 |

FOREIGN PATENT DOCUMENTS

| 2-250226 | 10/1990 | Japan |
| 3-159849 | 7/1991 | Japan |
| 6-295913 | 10/1994 | Japan |
| 6-296912 | 10/1994 | Japan |
| 8-97221 | 4/1996 | Japan |
| 8-97222 | 4/1996 | Japan |

*Primary Examiner*—Felisa Garrett
*Attorney, Agent, or Firm*—Finnegan, Henderson, Farabow, Garrett & Dunner, L.L.P.

[57] ABSTRACT

In a heat history initializing step, a heat treatment in performed in an atmosphere including at least one of hydrogen, helium, and argon while the temperature is increased in a range of 700° C. to 1,000° C. at a rate of 15°–1,000° C./min. In a controlled nuclei growing step, a heat treatment is performed in the above atmosphere while the temperature is kept constant in a range of 850° C. to 980° C. for 0.5–60 minutes.

11 Claims, 6 Drawing Sheets

MANUFACTURING METHOD OF A SILICON WAFER HAVING A CONTROLLED BMD CONCENTRATION

BACKGROUND OF THE INVENTION

1. Field of the Invention

The present invention relates to a silicon wafer for a semiconductor device and its manufacturing method. The invention also relates to a high-quality silicon wafer for such a semiconductor device as a VLSI.

2. Description of the Related Art

Silicon wafers are cut out of a single crystal silicon ingot. A silicon single crystal can be manufactured by the Czochralski method, in which material polysilicon is placed in a crucible of quartz glass ($SiO_2$), and while it is melted by heating, a silicon single crystal is pulled up and grown by using a seed crystal.

In general, oxygen is dissolved in a silicon single crystal produced by the Czochralski method. This is due to a phenomenon that oxygen is dissolved into a molten silicon liquid from the quartz crucible. In a cooling process after the pulling of a single crystal, it is caused to have a temperature history (cooling history) from the solidifying temperature (1,420° C.) to the room temperature, so that defects are formed therein at respective temperatures.

Among several types of defects is an ultra-small oxygen deposit (embryo) of 0.6–0.9 nm in size in a temperature decreasing process of 500°–450° C. In a heat treatment process, such as a device forming process, after the pulling of a single crystal, an embryo becomes a deposition nucleus and grows into an oxygen deposit (BMD). Deposition of BMDs in a wafer surface layer (which is to become device active layers) is undesirable because they may cause failures (e.g., leakage of electricity) in resulting devices.

On the other hand, BMDs occurring inside a wafer are useful defects because they trap contaminated metals. This is called an intrinsic gettering (IG) effect.

"HI wafer" (trade name) is a high-quality wafer in which BMDs are positively introduced inside the wafer before a device forming process. More specifically, a BMD layer is formed in the inside and the surface is formed with a DZ (denuded zone) layer by treating a mirror-polished, sliced wafer in a hydrogen atmosphere of 1,100°–1,300° C. for 0.1 to several hours. The DZ layer means a non-defect layer in which the concentration of oxygen deposits not smaller than 20 nm is not higher than $10^3$ $cm^{-3}$.

The concentration and size of embryos (ultra-small oxygen deposits), which will become deposition nuclei, strongly depend on the heat application history during pulling of a single crystal and the state of a molten silicon liquid. Therefore, the concentration and size of BMDs, which grow from embryo nuclei in a hydrogen treatment, considerably vary depending on the above conditions, resulting in variations in the quality of silicon wafer products.

However, it is technically very difficult to strictly control the single crystal pulling conditions. Therefore, it was considered difficult to improve the quality of silicon wafers by accurately controlling the concentration and size of BMDs, which grow from embryo nuclei.

The following measures are generally taken to eliminate BMDs from a layer to become device active layers: causing oxygen in the surface layer to diffuse outward and escape therefrom by subjecting a wafer to a high-temperature heat treatment in an inert gas atmosphere of hydrogen, argon, or the like; and forming an epitaxial layer on the wafer surface by reducing a silane-type gas in a hydrogen atmosphere. Usually, these heat treatments are conducted at a temperature as high as 1,100°–1,300° C., because the diffusion speed of oxygen in a silicon crystal is very low.

However, at a temperature higher than 1,000° C., the silicon crystal is liable to be deformed plastically. Therefore, when a temperature difference that is larger than a certain level in a wafer plane during high-temperature heating may cause a plastic deformation, resulting in slip defects. For example, when the average temperature of a wafer is 1,200° C., slip defects possibly occur even if the center-to-periphery temperature difference of a wafer is as small as several degrees.

In general, a horizontal furnace is used for a heat treatment of wafers smaller than 150 mm (6 in.) in diameter, while a vertical furnace is used for a heat treatment of wafers of 150 mm and wafers not smaller than 200 mm (8 in.). In these furnaces, a metallic heater is used to heat the whole inside space of the furnace.

On the other hand, in a process in which a high-temperature treatment of higher than several hundred degrees centigrade lasts only a short period, it is convenient to use a single-type (wafer-by-wafer type) apparatus, which accurately controls the temperature of a single wafer with a lamp or the like, and minimizes the heat capacity of the inside of the furnace so as to increase and decrease the temperature at a high rate.

The temperature difference in a wafer plane is maximum when the wafer temperature is decreased or, particularly, increased. One heating method for preventing slip defects is to increase the temperature at so low a rate that an equilibrium state is almost maintained. Although this slow temperature increase method is suitable for a large-sized furnace that accommodates a number of wafers, it cannot provide higher productivity than a certain level because of an increased process time.

On the other hand, although the single-type apparatus can prevent slip defects by optimizing the temperature distribution in a wafer plane by supplying an optimum amount of heat to a single wafer, it cannot improve the productivity sufficiently because of a small number of wafers processed.

As described above, in general, BMDs are removed from a layer to become device active layers by causing oxygen in the surface layer to diffuse outward and escape therefrom by subjecting a wafer to a high-temperature heat treatment in an inert gas atmosphere of hydrogen, argon, or the like, or forming an epitaxial layer on the wafer surface by reducing a silane-type gas in a hydrogen atmosphere.

Particularly in the case of a high-quality wafer to be used for such a semiconductor device as a VLSI, the device characteristics and the reliability are lowered if a wafer is contaminated with even a very small amount of metal impurities or even a small amount of minute defects exist in a wafer layer to become active layers (surface layer to a depth of 10 µm). Thus, it is difficult for the above conventional methods to produce high-quality wafers for highly integrated devices at a high yield.

To solve this problem, the present assignee has proposed several methods for producing high-quality silicon wafers, which methods are based on an intrinsic gettering (IG) method (see Japanese Unexamined Patent Publication Nos. Hei. 6-295912 and Hei. 6-295913 and Japanese Patent Application Nos. Hei. 6-229765 and Hei. 6-229766).

The IG method can form a DZ layer having only a small number of defects in a layer to become device active layers by diffusing oxygen outward by subjecting the wafer to a high-temperature heat treatment. Further, in the IG method, BMDS created in the bulk may cause strain in the silicon matrix to induce secondary dislocations and stacking faults, which can getter metal impurities.

In the methods proposed by the present assignee, a pre-stage heat treatment is performed to initialize the heat history of an ingot and to accommodate wafers of a wide oxygen concentration range. Thus, the pre-stage heat treatment is intended to uniformize the concentration and size of BMDs. However, in practice, it is difficult to completely diffuse outward minute oxygen deposits in a layer to become device active layers. On the other hand, these methods have a disadvantage of an increased number of heat treatment steps, which increases the cost.

Detailed considerations will now be made of technical problems associated with the manufacture of high-quality wafers. By performing the above-mentioned high-temperature heat treatment in an atmosphere of a 100% reducing gas or a 100% inert gas, the wafer surface is formed with a DZ layer and a BMD layer is formed in the bulk, to provide a certain degree of IG effect.

A heat treatment process consists of a temperature increasing process, a temperature holding process, and a temperature decreasing process. For example, the temperature increase rate is 10° C./min from the room temperature to 1,000° C., and 3° C./min from 1,000° C. to 1,200° C. The temperature is held at 1,200° C. for more than 1 hour, and then reduced at a rate of 3° C. from 1,200° C. to 800° C.

In the temperature increasing process, the temperature increase rate is set very low to prevent slip dislocations and due to furnace-related limitations. During this gradual temperature increase, BMDs grow in the bulk and outward diffusion of oxygen occurs in the surface layer to lower the oxygen concentration there. After the holding temperature is reached, the outward diffusion of oxygen and resulting disappearance of BMDs are accelerated in the surface layer. In the bulk, oxygen diffuses in the wafer and BMDs shrink, but they do not disappear because the amount of oxygen does not decrease much.

In the temperature decreasing process, due to its low rate, theoretically BMDs should grow even in the surface layer. However, in practice, since the amount of oxygen has decreased due to the outward diffusion, BMDs do not grow to allow formation of a DZ layer. On the other hand, BMDs further deposit and grow in the bulk.

According to experiments by the present inventors, in the above heat treatment process, the BMD concentration after the heat treatment depends on the initial oxygen concentration of a wafer. As indicated by mark "o" in FIG. 6, the BMD concentration increases as the initial oxygen concentration increases.

As seen from FIG. 6, in the case of wafers having an initial oxygen concentration of more than $1.6 \times 10^{18}$ atoms/cm$^3$, BMDs of more than $10^{19}$ cm$^{-3}$ are formed by the above heat treatment. Wafers having that many BMDs are superior in the metal impurity gettering effect. But the existence of BMDs in a layer to become device active layers and its neighborhood is disadvantageous in device characteristics. Further, excessive BMDs lower the mechanical strength of a wafer.

In wafers for the latest, highly integrated memory devices, it is more important to make the layer to become active layers closer to the non-defect layer (literal meaning) than to getter metal impurities that are introduced in a device forming process. As such, in spite of the need for wafers having a close-to-non-defect layer and a low BMD concentration, it is difficult for the above-described methods to produce such wafers at a low cost.

SUMMARY OF THE INVENTION

In view of the above problems in the art, an object of the present invention is to produce silicon wafers stable in quality by adjusting the BMD concentration.

Another object of the invention is to produce, efficiently and at a low cost, silicon wafers that have a DZ layer (non-defect layer) and are substantially free of slip defects.

A further object of the invention is to produce high-quality silicon wafers having a low BMD concentration in the bulk and a high degree of non-defectiveness in the layer to become device active layers even starting from wafers having a high oxygen concentration.

According to a first aspect of the invention, there is provided a manufacturing method of a silicon wafer, comprising the steps of:

initializing a heat history of a wafer produced from a single crystal silicon ingot, to thereby control a concentration of ultra-small oxygen deposits; and causing re-deposition nuclei to grow while controlling those.

According to a second aspect of the invention, there is provided a manufacturing method of a silicon wafer, comprising the steps of:

placing a wafer produced from a single crystal silicon ingot into a furnace;

increasing a wafer temperature in a range of 800° C. to 1,000° C. at a first rate of 15° to 1,000° C./min; and increasing the wafer temperature in a range of 1,000° C. to 1,300° C. at a second, low rate; and keeping the wafer temperature constant in a range of 1,100° C. to 1,300° C. for not less than 5 minutes.

According to a third aspect of the invention, there is provided a manufacturing method of a silicon wafer, comprising the steps of:

preparing a silicon wafer having an interstitial oxygen concentration of $1.4-1.8 \times 10^{18}$ atoms/cm$^3$;

placing the silicon wafer in a furnace;

filling the furnace with an atmosphere including at least one of hydrogen and an inert gas;

increasing a wafer temperature at a first rate of 15° to 100° C./min in a range of a room temperature to 900° C. and at a second rate of 1° to 15° C./min in a range of 900° C. to a holding temperature; and keeping the wafer temperature at the holding temperature that is in a range of 1,100° C. to 1,300° C. for 1 minute to 48 hours.

DESCRIPTION OF THE PREFERRED EMBODIMENTS

Embodiment 1

Figure 1:
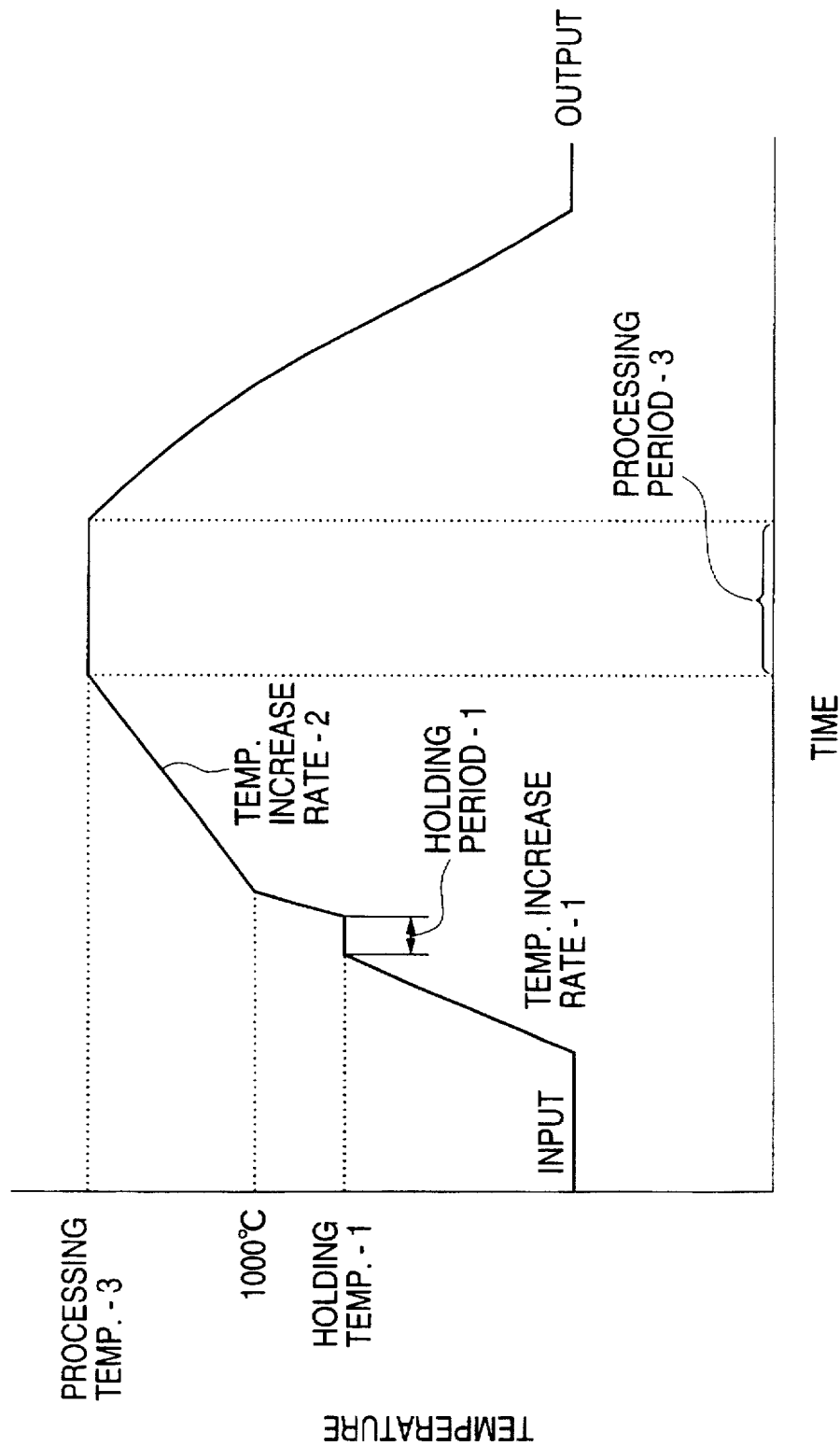
FIG. 1 is a temperature diagram showing a manufacturing method according to a first embodiment of the present invention.

A silicon wafer manufacturing method according to this embodiment uses wafers obtained by slicing a single crystal silicon ingot, and includes a heat history initializing step for controlling the concentration of ultra-small oxygen deposits (embryos) and a controlled nuclei growing step for causing deposition nuclei to grow again while controlling those. With these steps, the size of embryos can also be controlled.

A BMD concentration adjusted layer in which the concentration of oxygen deposits (BMDs) has been adjusted to $10^6$ to $10^{10}$ cm$^{-3}$ is formed in the inside of each wafer by the heat history initializing step and the controlled nuclei growing step. An even preferable range of the oxygen deposit concentration is $10^7$ to $10^9$ cm$^{-3}$. The IG effect is insufficient if the oxygen deposit concentration is lower than $10^6$ cm$^{-3}$, whereas slips are liable to occur in a wafer because of its insufficient mechanical strength if the oxygen deposit concentration is higher than $10^{10}$ cm$^{-3}$.

It is desirable that the interstitial oxygen concentration $O_i$ of wafers produced by slicing a single crystal silicon ingot be $1.2$–$1.8 \times 10^{18}$ atoms/cm$^3$. Where the interstitial oxygen concentration is out of this range, it is difficult, even with the heat history initializing step and the controlled nuclei growing step, to sufficiently increase the BMD concentration, i.e., to attain a sufficient degree of IG effect.

The heat history initializing step is a heat treatment step in which wafers are heated in an atmosphere preferably including at least one of hydrogen, helium, and argon while the temperature is increased in a range of 700° C. to 1,000° C. at a rate of 15°–1,000° C./min. If the temperature increase rate is out of this range, it is not assured that the concentration and size of embryos are completely initialized, i.e., some variations remain. That is, the heat history cannot be initialized by rendering embryos in a dissolved state.

The controlled nuclei growing step is a heat treatment step performed in an atmosphere preferably including at least one of hydrogen, helium, and argon in which the temperature is kept constant in a range of 850° C. to 980° C. for 0.5–60 minutes. By causing deposit nuclei to grow again while controlling those in the controlled nuclei growing step in the above manner, stable deposition of BMDs is attained.

After the heat history initializing step and the controlled nuclei growing step, there may be performed, in an atmosphere including at least one of hydrogen, helium, and argon, a heat treatment in which the wafers are heated while the temperature is increased in a range of 1,000° C. to 1,300° C. at a rate of 0.5°–5° C./min, and a heat treatment in which the temperature is kept constant in a range of 1,100° C. to 1,300° C. for not less than 5 minutes. This enables stable deposition (growth) of BMDs in the inside of each wafer as well as allows the wafer surface to be formed with a DZ layer.

The DZ layer means a non-defect layer in which the concentration of oxygen deposits (BMDs) not smaller than 20 nm is not higher than $10^3$ cm$^{-3}$. It is desirable that the DZ layer be formed at a thickness of at least 3 µm from the wafer surface. If the DZ layer is thinner than 3 µm, there may occur failures such as leakage in a device forming step, disabling production of high-quality silicon wafers.

FIG. 1 shows a temperature application schedule of the heat treatment steps of this embodiment. In FIG. 1, "temperature increase rate-1" and "holding temperature-1" ("holding period-1") correspond to the heat history initializing step and the controller nuclei growing step, respectively. In the steps corresponding to "temperature increase rate-2" and "processing temperature-3" ("processing period-3"), BMDs deposit (grow) stably in the inside of each wafer and the wafer surface is formed with a DZ layer.

Figure 2:
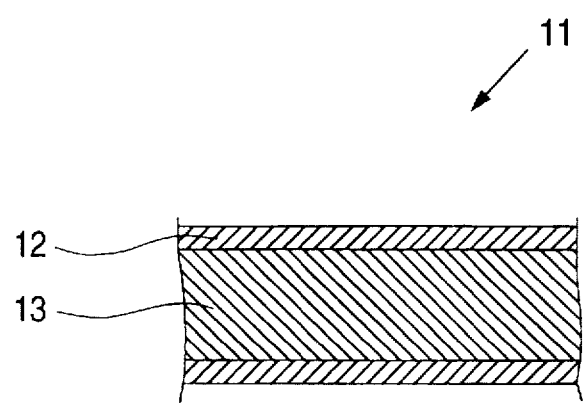
FIG. 2 is a sectional view schematically showing a silicon wafer produced by the first embodiment of the invention.

FIG. 2 is a sectional view schematically showing a silicon wafer produced by this embodiment. A silicon wafer 11 includes an inside BMD concentration adjusted layer 13 and a DZ layer 12. An intermediate layer (not shown) is usually formed between the layers 12 and 13.

Silicon wafers were actually produced according to the method of this embodiment and a conventional method, and those wafers were compared with each other.

First, single crystal silicon ingots were produced by pulling under several different conditions, and sliced into wafers. Table 1 shows results of oxygen concentration values measured.

Those wafers were subjected to heat treatments under processing conditions shown in Table 2. Five wafers were prepared for each condition and heat-treated together. In the conventional method, no holding step at 850°–980° C. was performed in the midst of increasing the temperature.

After the heat treatments, resulting silicon wafers were subjected to a BMD concentration measurement, results of which are shown in Table 3.

TABLE 1

| Pulling condition | Oxygen concentration $O_i$ (atoms/cm$^3$) |
|---|---|
| A | $1.35 \times 10^{18}$ |
| B | $1.35 \times 10^{18}$ |
| C | $1.55 \times 10^{18}$ |
| D | $1.55 \times 10^{18}$ |
| E | $1.60 \times 10^{18}$ |
| F | $1.60 \times 10^{18}$ |

TABLE 2

| Condition No. | Atmosphere | Input temp. (°C.) | Increase rate-1 (°C./min) | Holding temp. (°C.) | Holding period (min) | Increase rate-2 (°C./min) | Processing temp.-3 (°C) | Processing period-3 (hr) |
|---|---|---|---|---|---|---|---|---|
| 1 | H$_2$-100% | 700 | 20 | 900 | 20 | 2 | 1,200 | 60 |
| 2 | H$_2$-100% | 800 | 20 | 900 | 20 | 2 | 1,200 | 60 |
| 3 | H$_2$-100% | 700 | 15 | 900 | 20 | 2 | 1,200 | 60 |
| 4 | H$_2$-100% | 700 | 30 | 900 | 20 | 2 | 1,200 | 60 |
| 5 | H$_2$-100% | 700 | 20 | 850 | 20 | 2 | 1,200 | 60 |
| 6 | H$_2$-100% | 700 | 20 | 980 | 20 | 2 | 1,200 | 60 |
| 7 | H$_2$-100% | 700 | 20 | 900 | 1 | 2 | 1,200 | 60 |

TABLE 2-continued

| Condition No. | Atmosphere | Input temp. (°C.) | Increase rate-1 (°C./min) | Holding temp. (°C.) | Holding period (min) | Increase rate-2 (°C./min) | Processing temp.-3 (°C) | Processing period-3 (hr) |
|---|---|---|---|---|---|---|---|---|
| 8 | $H_2$-100% | 700 | 20 | 900 | 60 | 2 | 1,200 | 60 |
| 9 | $H_2$-100% | 700 | 20 | 900 | 20 | 3 | 1,200 | 60 |
| 10 | $H_2$-100% | 700 | 20 | 900 | 20 | 2 | 1,100 | 60 |
| 11 | $H_2$-100% | 700 | 20 | 900 | 20 | 2 | 1,250 | 60 |
| 12 | $H_2$-100% | 700 | 20 | 900 | 20 | 2 | 1,200 | 10 |
| 13 | $H_2$-100% | 700 | 20 | 900 | 20 | 2 | 1,200 | 180 |
| 14 | Ar-100% | 700 | 20 | 900 | 20 | 2 | 1,200 | 60 |
| 15 | He-100% | 700 | 20 | 900 | 20 | 2 | 1,200 | 60 |
| 16 | $H_2$-50% Ar-50% | 700 | 20 | 900 | 20 | 2 | 1,200 | 60 |

TABLE 3

| Experiment No. | Wafer | Condition No. | Average BMD concentration ($\times 10^6$ cm$^{-3}$) | Maximum BMD concentration ($\times 10^6$ cm$^{-3}$) | Minimum BMD concentration ($\times 10^6$ cm$^{-3}$) | DZ thickness (μm) | Remarks |
|---|---|---|---|---|---|---|---|
| P1 | A | 1 | 4.4 | 5.0 | 4.1 | 9 | Invention |
| P2 | B | 1 | 4.6 | 4.8 | 4.2 | 9 | Invention |
| R1 | A | 1 (No holding) | 8.0 | 2.0 | 13 | 9 | Conv. |
| R2 | B | 1 (No holding) | 12 | 2.0 | 16 | 9 | Conv. |
| P3 | C | 7 | 78 | 75 | 79 | 9 | Invention |
| P4 | D | 7 | 75 | 70 | 78 | 9 | Invention |
| R3 | C | 7 (No holding) | 100 | 55 | 165 | 9 | Conv. |
| R4 | D | 7 (No holding) | 180 | 100 | 250 | 9 | Conv. |
| P5 | E | 14 | 530 | 500 | 590 | 9 | Invention |
| P6 | F | 14 | 570 | 510 | 580 | 9 | Invention |
| R5 | E | 14 (No holding) | 790 | 250 | 1050 | 9 | Conv. |
| R6 | F | 14 (No holding) | 570 | 250 | 1100 | 9 | Conv. |
| P7 | C | 16 | 85 | 70 | 89 | 9 | Invention |
| P8 | D | 16 | 90 | 84 | 96 | 9 | Invention |
| R7 | C | 16 (No holding) | 150 | 40 | 220 | 9 | Conv. |
| R8 | D | 16 (No holding) | 270 | 150 | 390 | 9 | Conv. |

As seen from Table 3, in the conventional heat treatments, even with wafers having the same oxygen concentration at the time of slicing ingots, the BMD concentration varies by more than 50% and more than several times in extreme cases.

In contrast, in the heat treatments of this embodiment, with wafers having the same oxygen concentration, the BMD concentration varies by only less than 15%. According to the embodiment, the variation of the oxygen concentration can be made as low as 40% in the worst case.

It is expected that this embodiment allows BMDs to be distributed generally uniformly in the inside of a wafer, that is, this embodiment can make a variation of the BMD concentration in the same wafer very small.

According to this embodiment, the BMD concentration in the inside of a wafer is adjusted by the heat history initializing step and the controlled nuclei growing step. Therefore, it becomes possible to produce silicon wafers exhibiting a superior IG effect and being stable in quality.

Embodiment 2

Figure 3:
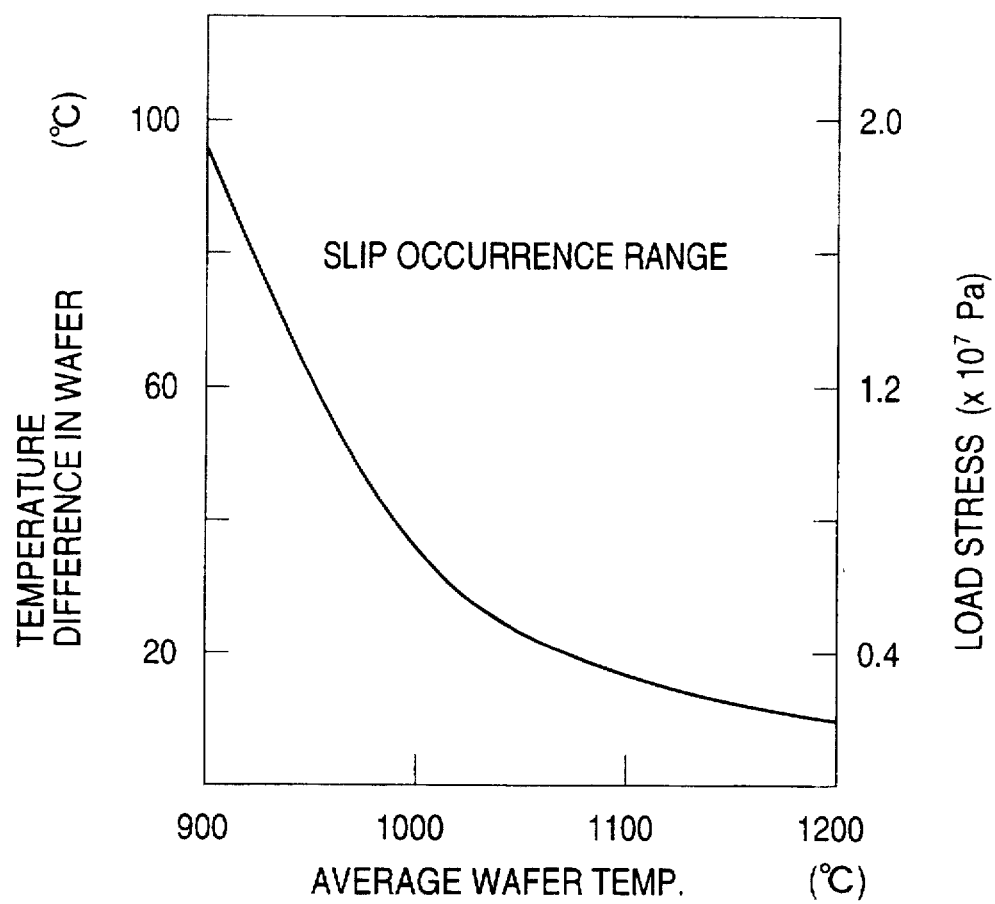
FIG. 3 is a graph showing a range of conditions for occurrence of slips.

FIG. 3 is a graph showing a range of conditions for occurrence of slip defects in a case where a temperature difference exists in a silicon wafer, in which the horizontal axis represents the average temperature of a wafer. The part of the graph above the curve is a slip occurrence range. The present inventors have found that slips occur at a high possibility when the temperature distribution in a wafer is located in the slip occurrence range.

As seen from FIG. 3, as the temperature exceeds 1,000° C., the possibility of occurrence of slip defects steeply increases, that is, slip defects come to appear even with a small temperature difference in a wafer. Therefore, at a temperature higher than 1,000° C., it is necessary to manage the wafer temperature more strictly.

In view of the above nature of the occurrence of slip defects, this embodiment employs the following heat treatments to form a non-defect layer (DZ layer) in a layer to become device active layers of a silicon wafer. An initial temperature increase step is performed in which the temperature is increased in a range of 800° C. to 1,000° C. at a rate of 15°–100° C./min, then a gradual temperature increase step is performed in which the temperature is increased at a low rate in a range of 1,000° C. to 1,300° C., and finally a temperature holding step is performed in which the temperature is kept constant in a range of 1,100° C. to 1,300° C. for not less than 5 minutes.

It is preferable that in the gradual temperature increase the temperature increase rate be 0.5°–10° C./min. It is even preferable that in that step the temperature increase rate be 1°–5° C./min.

If the temperature increase rate is lower than 0.5° C., the heat treatment takes so long time that the manufacturing cost becomes unduly high. If it is higher than 10° C./min, the temperature difference in a wafer becomes too large to positively prevent occurrence of slip defects.

If the initial temperature increase step is performed at a rate lower than 15° C./min, minute nuclei (embryos), which may cause crystal defects in the inside of a wafer, grow to enhance the generation of BMDs, disabling formation of a good non-defect layer. A temperature increase rate higher than 100° C./min is not practical because of large heat stress imparted to a wafer.

As for the temperature holding step, if the holding temperature is lower than 1,000° C., the efficiency of outward oxygen diffusion is too low to allow formation of a good non-defect layer. If it is higher than 1,300° C., BMDs grow excessively in the inside of a wafer, lowering its mechanical strength.

It is preferred that the above heat treatments be performed in an atmosphere including at least one of hydrogen, helium, and argon.

By performing the above heat treatments, the wafer surface is formed with a non-defect layer (DZ layer) which is not thinner than 3 μm, and in which the concentration of oxygen deposits (BMDs) is not higher than $10^3$ cm$^{-3}$. If the DZ layer is thinner than 3 μm, a high-quality silicon wafer cannot be obtained because of such problems as leakage in a device forming step.

The upper limit of the thickness of the DZ layer is set at about 30 μm, because if the DZ layer is thicker than about 30 μm, there occur such problems as lowering of the gettering effect on the DZ layer of a BMD layer formed in the inside of a wafer.

It is possible for the above heat treatments to form a BMD layer in the inside of a silicon wafer. The BMD layer is a layer that contains oxygen deposits and exhibits the intrinsic gettering (IG) effect. To form such a BMD layer, it is desirable that wafers obtained by slicing a single crystal silicon ingot have an interstitial oxygen concentration $O_i$ of $1.2–1.8 \times 10^{18}$ atoms/cm$^3$.

Figure 4:
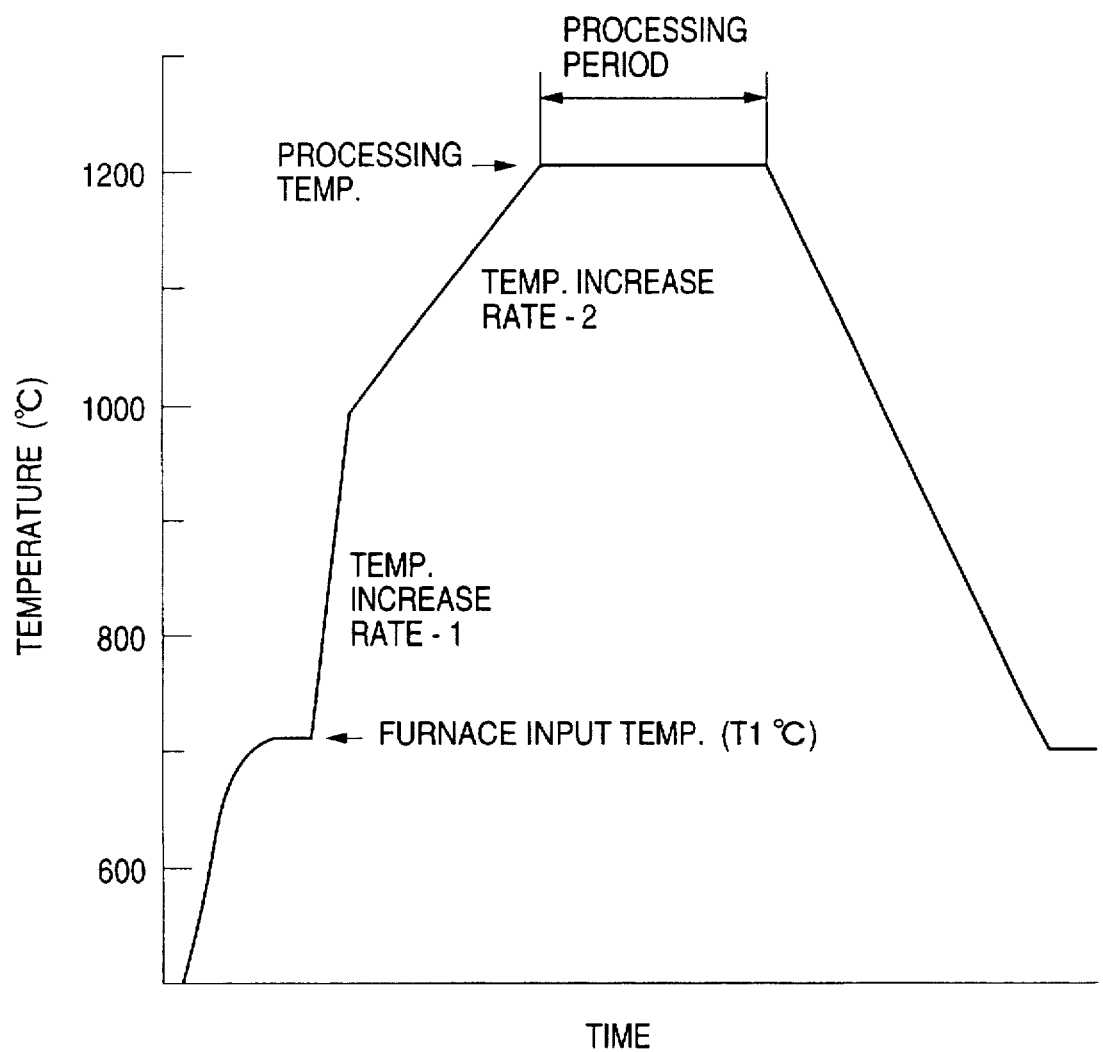
FIG. 4 is a temperature diagram showing a manufacturing method according to a second embodiment of the invention.

FIG. 4 shows an example of heat treatment steps according to this embodiment. In FIG. 4, a temperature increasing step from a furnace input temperature T1° C. to 1,000° C. is indicated by "temperature increase rate-1," a temperature increasing step from 1,000° C. to 1,200° C. is indicated by "temperature increase rate-2," and a temperature holding step that is performed after those temperature increasing steps is indicated by "heat treatment."

Silicon wafers were actually produced by the method of this embodiment. As comparative examples, silicon wafers were also produced by changing part of the heat treatment conditions.

First, silicon wafers having average oxygen contents of $1.3 \times 10^{18}$, $1.5 \times 10^{18}$ and $1.7 \times 10^{18}$ atoms/cm$^3$ (respectively denoted by W-A, W-B and W-C) were formed by pulling up single crystal silicon ingots under different pulling conditions and slicing those ingots.

Those wafers were subjected to heat treatments shown in Table 4, in which HT01–HT10 are comparative examples and HT11–HT38 are examples of this embodiment.

HT01–HT05 are comparative examples in which the temperature increase rate was kept constant in a range of 230° C./min. HT06 and HT07 are comparative examples in which temperature increase rate-1 after the wafer inputting was set at 30° C./min and subsequent temperature increase rate-2 was decreased to 20° or 15° C./min. HT08 is a comparative example in which the processing atmosphere gas was argon rather than hydrogen. HT09 and HT10 are comparative examples in which temperature increase rate-1 was increased to 40° or 50° C./min.

HT11–HT13 are examples of the embodiment in which the furnace input temperature was set at 600° C., 700° C. and 800° C., respectively. HT14–HT18 are examples of the embodiment which are the same as HT12 except that temperature increase rate-2 was set at 0.5°, 1°, 5°, 10° and 15° C./min, respectively. HT19–HT22 are examples of the embodiment which are the same as HT12 except that temperature increase rate-1 was set at 20°, 50°, 60° and 80° C./min, respectively. HT23–HT26 are examples of the embodiment which are the same as HT12 except that the "processing temperature" was set at 1,100° C., 1,150° C., 1,250° C. and 1,290° C., respectively. HT27 and HT28 are examples of the embodiment which are the same as HT12 except that the process atmosphere gas was argon and helium, respectively, rather than hydrogen. HT29–HT33 are examples of the embodiment in which the heat treatments were conducted in a 2-component or 3-component gas atmosphere of hydrogen, argon, and helium.

TABLE 4

| No. | Atmosphere | Input temp. (°C.) | Increase rate-1 (°C./min) | Rate changing temp. (°C.) | Increase rate-2 (°C./min) | Processing temp. (°C.) | Processing period (min) | Remarks |
|---|---|---|---|---|---|---|---|---|
| HT01 | H$_2$ | 700 | 30 | 1,000 | 30 | 1,200 | 60 | Comp. Ex. |
| HT02 | H$_2$ | 700 | 20 | 1,000 | 20 | 1,200 | 60 | |
| HT03 | H$_2$ | 700 | 10 | 1,000 | 10 | 1,200 | 60 | |
| HT04 | H$_2$ | 700 | 5 | 1,000 | 5 | 1,200 | 60 | |
| HT05 | H$_2$ | 700 | 2 | 1,000 | 2 | 1,200 | 60 | |
| HT06 | H$_2$ | 700 | 30 | 1,000 | 20 | 1,200 | 60 | |
| HT07 | H$_2$ | 700 | 30 | 1,000 | 15 | 1,200 | 60 | |
| HT08 | Ar | 700 | 30 | 1,000 | 15 | 1,200 | 60 | |
| HT09 | H$_2$ | 700 | 40 | 1,000 | 15 | 1,200 | 60 | |
| HT10 | H$_2$ | 700 | 50 | 1,000 | 15 | 1,200 | 60 | |
| HT11 | H$_2$ | 600 | 30 | 1,000 | 2 | 1,200 | 60 | Invention |
| HT12 | H$_2$ | 700 | 30 | 1,000 | 2 | 1,200 | 60 | |
| HT13 | H$_2$ | 800 | 30 | 1,000 | 2 | 1,200 | 60 | |
| HT14 | H$_2$ | 700 | 30 | 1,000 | 0.5 | 1,200 | 60 | |

TABLE 4-continued

| No. | Atmosphere | Input temp. (°C.) | Increase rate-1 (°C./min) | Rate changing temp. (°C.) | Increase rate-2 (°C./min) | Processing temp. (°C.) | Processing period (min) | Remarks |
|---|---|---|---|---|---|---|---|---|
| HT15 | $H_2$ | 700 | 30 | 1,000 | 1 | 1,200 | 60 | |
| HT16 | $H_2$ | 700 | 30 | 1,000 | 5 | 1,200 | 60 | |
| HT17 | $H_2$ | 700 | 30 | 1,000 | 10 | 1,200 | 60 | |
| HT18 | $H_2$ | 700 | 30 | 1,000 | 15 | 1,200 | 60 | |
| HT19 | $H_2$ | 700 | 20 | 1,000 | 5 | 1,200 | 60 | |
| HT20 | $H_2$ | 700 | 50 | 1,000 | 5 | 1,200 | 60 | |
| HT21 | $H_2$ | 700 | 60 | 1,000 | 5 | 1,200 | 60 | |
| HT22 | $H_2$ | 700 | 80 | 1,000 | 5 | 1,200 | 60 | |
| HT23 | $H_2$ | 700 | 30 | 1,000 | 2 | 1,100 | 60 | Invention |
| HT24 | $H_2$ | 700 | 30 | 1,000 | 2 | 1,150 | 60 | |
| HT25 | $H_2$ | 700 | 30 | 1,000 | 2 | 1,250 | 60 | |
| HT26 | $H_2$ | 700 | 30 | 1,000 | 2 | 1,290 | 60 | |
| HT27 | Ar | 700 | 30 | 1,000 | 2 | 1,200 | 60 | |
| HT28 | He | 700 | 30 | 1,000 | 2 | 1,200 | 60 | |
| HT29 | $H_2$(20%) + Ar(80%) | 700 | 30 | 1,000 | 2 | 1,200 | 60 | |
| HT30 | $H_2$(50%) + Ar(50%) | 700 | 30 | 1,000 | 2 | 1,200 | 60 | |
| HT31 | $H_2$(80%) + Ar(20%) | 700 | 30 | 1,000 | 2 | 1,200 | 60 | |
| HT32 | $H_2$(50%) + He(50%) | 700 | 30 | 1,000 | 2 | 1,200 | 60 | |
| HT33 | $H_2$(30%) + Ar(40%) + He(30%) | 700 | 30 | 1,000 | 2 | 1,200 | 60 | |
| HT34 | $H_2$ | 700 | 30 | 1,000 | 2 | 1,200 | 5 | |
| HT35 | $H_2$ | 700 | 30 | 1,000 | 2 | 1,200 | 15 | |
| HT36 | $H_2$ | 700 | 30 | 1,000 | 2 | 1,200 | 30 | |
| HT37 | $H_2$ | 700 | 30 | 1,000 | 2 | 1,200 | 120 | |
| HT38 | $H_2$ | 700 | 30 | 1,000 | 2 | 1,200 | 240 | |

Results of the experiments for the wafers W-A, W-B and W-C are shown in Tables 5–7, respectively. As seen from Tables 5–7, even if the oxygen concentration of wafers is varied, the DZ layer thickness and the degree of occurrence of slips have almost no variations. Further, in any of the examples, the DZ layer was not thinner than 3 µm.

Even when the furnace input temperature was varied between 600° C. to 800° C., no slip occurred (HT11–HT13).

Even when temperature increase rate-1 (to 1,000° C.) is as high as 30° C./min, the occurrence of slip defects was prevented by lowering subsequent temperature increase rate-2 (HT14–HT18).

Further, even when temperature increase rate-1 (to 1,000° C.) was increased from 20° C./min to 80° C./min, no slip defect occurred or slip defects occurred only slightly (HT19–HT22).

In Tables 5–7, the "scale of slips" was judged according to JIS H0609-1994, "Method of Observing Crystal Defects of Silicon Due to Selective Etching." Specifically, "small" means that slips occur at only one location on a wafer observed and the number of slips is not greater than 10. "Medium" means that slips occur at only one location and the number of slips is greater than 10, or slips occur at a plurality of locations and the total number of slips is not greater than 50. "Large" means that slips occur at a plurality of locations and the total number of slips exceeds 50.

When the "processing temperature" was varied between 1,100° C. and 1,290° C., the DZ layer became thicker as the temperature increased. Although slips became more liable to occur as the temperature increased, their scale was very small (HT23–HT26).

Even with an atmosphere of helium or argon, or an atmosphere in which hydrogen was mixed with helium and/or argon, a DZ layer was formed in the same manner as with an atmosphere consisting only of hydrogen and no slips occurred (HT27–HT33).

When the "processing period" was increased from 5 to 240 minutes, the DZ layer thickness merely increased without occurrence of slips (HT34–HT38).

TABLE 5

| Wafer type | Conditions | DZ layer thickness (µm) | Scale of slips |
|---|---|---|---|
| W-A | HT01 | 9 | Large |
| | HT02 | 9 | Large |
| | HT03 | 9 | Medium |
| | HT04 | 10 | Small |
| | HT05 | 10 | None |
| | HT06 | 9 | Large |
| | HT07 | 9 | Medium |
| | HT08 | 9 | Medium |
| | HT09 | 9 | Medium |
| | HT10 | 9 | Large |
| W-A | HT11 | 10 | None |
| | HT12 | 10 | None |
| | HT13 | 10 | None |
| | HT14 | 12 | None |
| | HT15 | 11 | None |
| | HT16 | 10 | None |
| | HT17 | 10 | None |
| | HT18 | 9 | Small |
| | HT19 | 10 | None |
| | HT20 | 10 | None |
| | HT21 | 10 | Small |
| | HT22 | 10 | Small |
| | HT23 | 6 | None |
| | HT24 | 8 | None |
| | HT25 | 18 | None |
| | HT26 | 27 | Small |
| | HT27 | 9 | None |
| | HT28 | 9 | None |
| | HT29 | 9 | None |
| | HT30 | 10 | None |

TABLE 5-continued

| Wafer type | Conditions | DZ layer thickness (μm) | Scale of slips |
|---|---|---|---|
|  | HT31 | 10 | None |
|  | HT32 | 10 | None |
|  | HT33 | 10 | None |
|  | HT34 | 3 | None |
|  | HT35 | 5 | None |
|  | HT36 | 7 | None |
|  | HT37 | 15 | None |
|  | HT38 | 21 | None |

TABLE 6

| Wafer type | Conditions | DZ layer thickness (μm) | Scale of slips |
|---|---|---|---|
| W-B | HT01 | 9 | Large |
|  | HT02 | 9 | Large |
|  | HT03 | 9 | Medium |
|  | HT04 | 9 | None |
|  | HT05 | 10 | None |
|  | HT06 | 9 | Large |
|  | HT07 | 9 | Medium |
|  | HT08 | 9 | Medium |
|  | HT09 | 9 | Medium |
|  | HT10 | 9 | Large |
| W-B | HT11 | 10 | None |
|  | HT12 | 10 | None |
|  | HT13 | 10 | None |
|  | HT14 | 11 | None |
|  | HT15 | 10 | None |
|  | HT16 | 10 | None |
|  | HT17 | 10 | None |
|  | HT18 | 9 | None |
|  | HT19 | 10 | None |
|  | HT20 | 10 | None |
|  | HT21 | 10 | None |
|  | HT22 | 10 | Small |
|  | HT23 | 6 | None |
|  | HT24 | 8 | None |
|  | HT25 | 18 | Small |
|  | HT26 | 26 | Small |
|  | HT27 | 9 | None |
|  | HT28 | 9 | None |
|  | HT29 | 9 | None |
|  | HT30 | 10 | None |
|  | HT31 | 10 | None |
|  | HT32 | 10 | None |
|  | HT33 | 10 | None |
|  | HT34 | 3 | None |
|  | HT35 | 5 | None |
|  | HT36 | 7 | None |
|  | HT37 | 15 | None |
|  | HT38 | 21 | None |

TABLE 7

| Wafer type | Conditions | DZ layer thickness (μm) | Scale of slips |
|---|---|---|---|
| W-C | HT01 | 8 | Large |
|  | HT02 | 9 | Medium |
|  | HT03 | 9 | Medium |
|  | HT04 | 9 | None |
|  | HT05 | 10 | None |
|  | HT06 | 9 | Large |
|  | HT07 | 9 | Small |
|  | HT08 | 9 | Small |
|  | HT09 | 8 | Medium |
|  | HT10 | 8 | Large |
| W-C | HT11 | 9 | None |
|  | HT12 | 9 | None |
|  | HT13 | 9 | None |
|  | HT14 | 10 | None |
|  | HT15 | 10 | None |
|  | HT16 | 9 | None |

TABLE 7-continued

| Wafer type | Conditions | DZ layer thickness (μm) | Scale of slips |
|---|---|---|---|
|  | HT17 | 9 | None |
|  | HT18 | 9 | None |
|  | HT19 | 10 | None |
|  | HT20 | 10 | None |
|  | HT21 | 9 | None |
|  | HT22 | 9 | Small |
|  | HT23 | 5 | None |
|  | HT24 | 7 | None |
|  | HT25 | 17 | Small |
|  | HT26 | 25 | Small |
|  | HT27 | 9 | None |
|  | HT28 | 9 | None |
|  | HT29 | 9 | None |
|  | HT30 | 10 | None |
|  | HT31 | 10 | None |
|  | HT32 | 10 | None |
|  | HT33 | 10 | None |
|  | HT34 | 3 | None |
|  | HT35 | 5 | None |
|  | HT36 | 7 | None |
|  | HT37 | 14 | None |
|  | HT38 | 19 | None |

As is apparent from the above experiments, this embodiment can produce, efficiently and at a low cost, a high-quality silicon wafer whose surface is formed with a DZ layer of more than 3 μm in thickness and is substantially free of slip defects.

It is noted that this embodiment is applicable to silicon wafers which have been produced by the FZ (float zone) method and have a relatively small oxygen content. Also in such a case, the embodiment can modify the wafer surface by forming a DZ layer while further reducing the oxygen concentration in the surface layer.

Embodiment 3

It is noted that oxygen concentration values that will appear in this embodiment are ones according to the conversion coefficients of Old ASTM.

First, a description will be made of general behavior of BMDs in heat-treating a wafer. According to the classical nuclei formation theory, a BMD grows or shrinks such that supersaturated oxygen is attached to or removed from a an oxygen cluster serving as a homogeneous nucleus. Whether a BMD grows or shrinks/disappears depends on the critical nucleus radius at a time point concerned. The critical nucleus radius is determined by the size of a BMD, the temperature, and the oxygen concentration. The critical nucleus radius is larger for a higher temperature. Where a wafer is kept at a certain temperature, a BMD larger than its critical nucleus radius at that temperature continues to grow while a BMD smaller than its critical nucleus radius shrinks/disappears.

By applying the above knowledge to the wafer manufacture, the present inventors have found that wafers suitable for manufacture of highly integrated devices can be produced by properly controlling the BMD behavior, and completed this aspect of the invention.

This embodiment is characterized in that a silicon wafer having an interstitial oxygen concentration $O_i$ of $1.4$–$1.8 \times 10^{18}$ atoms/cm$^3$ is subjected to a temperature holding step which is performed at a temperature between 1,100° C. and 1,300° C. for 1 minute to 48 hours in an atmosphere including at least hydrogen and an inert gas, and that a temperature increase rate in a range of the room temperature to 900° C. is set at 15°–100° C./min and a temperature increase rate in a range of 900° C. to the holding temperature is set at 1°–15° C./min.

As for the temperature holding step, if the holding temperature is lower than 1,100° C., the BMD concentration cannot be made low. If it exceeds 1,300° C., the safety and the reliability of the manufacturing apparatus may not be assured.

If the duration of the temperature holding step is shorter than 1 minute, the BMD concentration cannot be made low enough to ensure the intended effects of the invention. Even if the temperature holding step continues for more than 48 hours, no added effects can be attained.

As for the temperature increasing step (room temperature to 900° C.), by setting the temperature increase rate at not less than 15° C./min, the effective increase rate of the critical nucleus radius can be made higher than the effective growth rate of BMDs. As a result, the critical nucleus radius can be larger than radii of a considerable part of existing BMDs, which therefore shrink. However, since the temperature increase rate is relatively high and the temperature increasing step lasts for only a short period, the number of BMDs that completely disappear during this step is not large (almost no BMDs disappear under certain conditions). Naturally the number of BMDs large enough to be detected is decreased to some extent.

It is preferable that the temperature increase rate in the range of the room temperature to 900° C. be set not lower than 20° C./min. It is even preferable that the above temperature increase rate be set not lower than 30° C./min. By employing such a high temperature increase rate, the concentration of large (or detectable) BMDs can further be reduced.

In the range of 900° C. to the holding temperature, if the temperature increase rate exceeds 15° C./min, the BMD concentration becomes so low that the gettering effect becomes insufficient and slips become liable to occur, which will cause problems in a device forming step. If the temperature increase rate is lower than 1° C./min, the BMD concentration becomes too high to ensure the intended effects of the invention. Resulting wafers will not be suitable for formation of highly integrated devices.

It is preferable that the temperature increase rate in the range of 900° C. to the holding temperature be set at 510° C./min. In this case, the above-described advantage of the invention can be enhanced.

Figure 5:
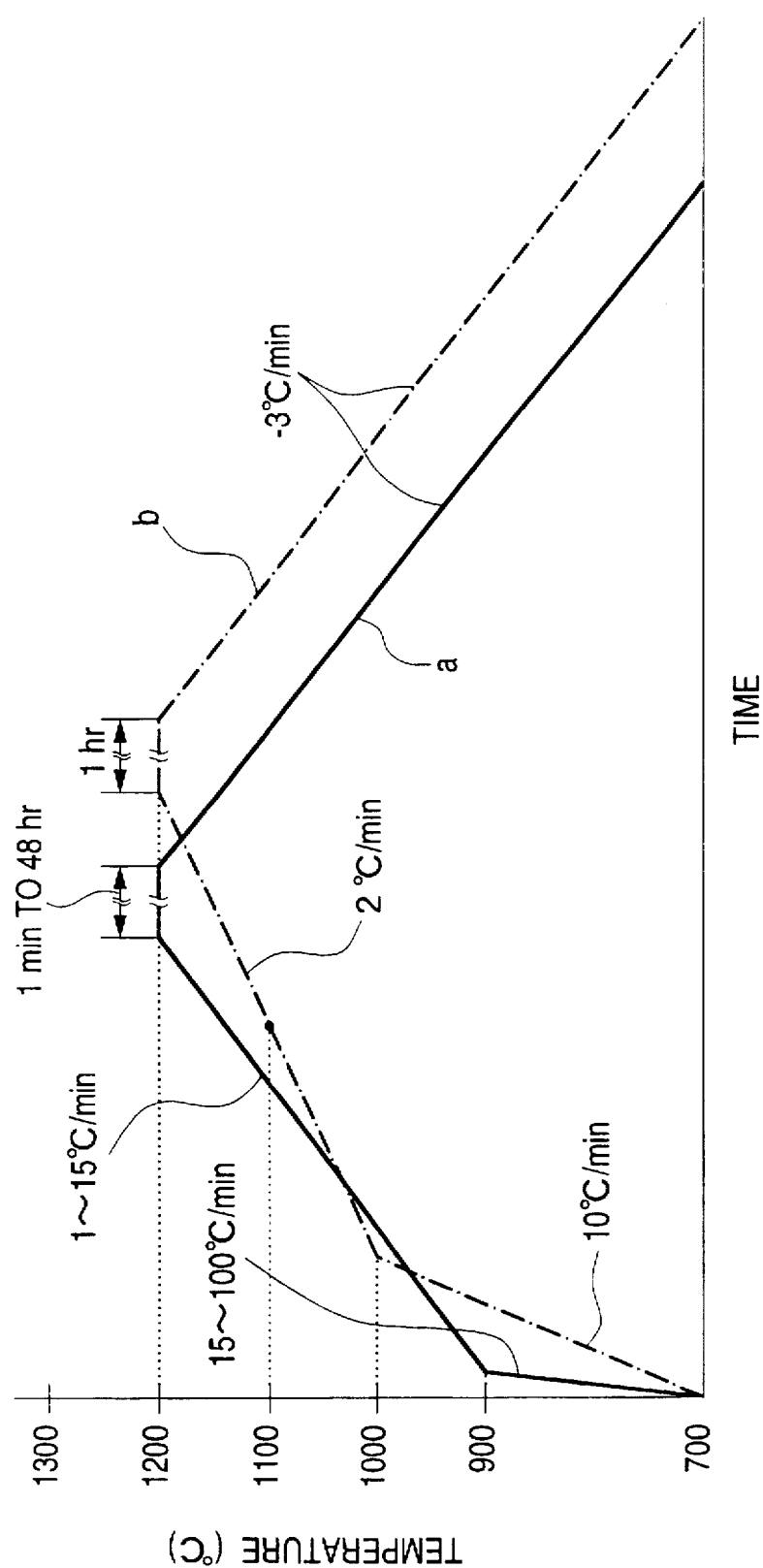
FIG. 5 is a temperature diagram showing a manufacturing method according to a third embodiment of the invention and a conventional manufacturing method.

Referring to FIG. 5, solid line a indicates an example of a heat treatment process of this embodiment and chain line b indicates an example of a conventional heat treatment process.

By performing the above heat treatments, this embodiment can form a DZ layer which is not thinner than 10 μm (as measured from the surface) and in which the concentration of BMDs not smaller than 20 nm in diameter is not more than $10^3$ cm$^{-3}$, and a bulk portion having an oxygen deposit concentration of $1 \times 10^3$ cm$^{-3}$ to $\exp(9.21 \times 10^{-18} \times O_i + 3.224)$ cm$^{-3}$. Such silicon wafers correspond to a region A+B+C in the graph of FIG. 6.

Figure 6:
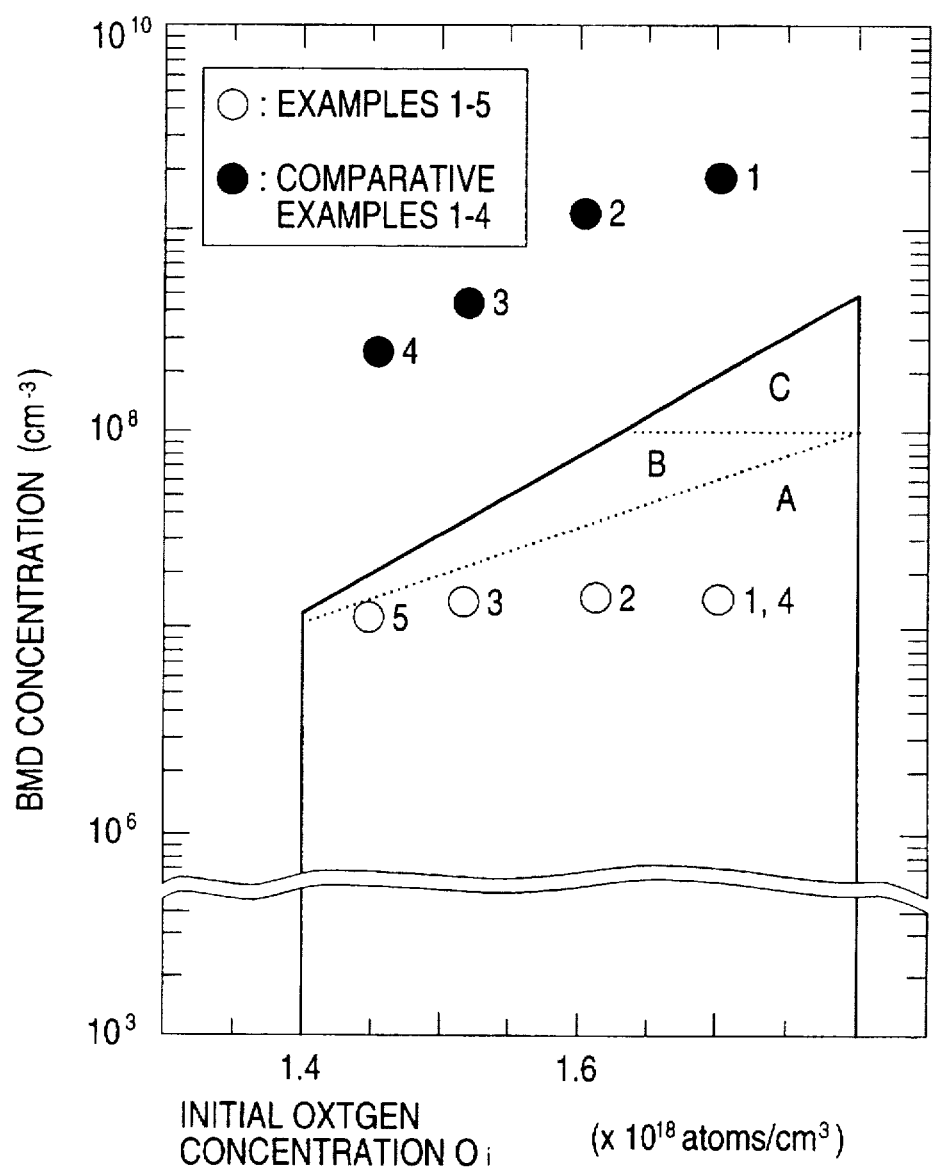
FIG. 6 is a graph showing a relationship between the initial oxygen concentration and the BMD concentration.

It is preferable that the BMD concentration be from $1 \times 10^3$ cm$^{-3}$ to the smaller one of $1 \times 10^8$ cm$^{-3}$ and $\exp(9.210 \times 10^{-18} \times O_i + 3.224)$ cm$^{-3}$ (region A+B in FIG. 6). It is even preferable that the BMD concentration be not higher than $\exp(5.757 \times 10^{-18} \times O_i + 3.224)$ cm$^{-3}$ (region A in FIG. 6).

A wafer having a BMD concentration within the above range exhibits the gettering function. Further, a superior DZ layer (non-defect layer) is formed in a surface layer to become device active layers, and sufficient mechanical strength is assured.

It is preferred that substantially no BMDs exist in a surface DZ layer. The reasons why the BMD concentration range in a DZ layer is specified in the above manner are that the minimum detectable BMD size of the currently available measuring devices is 20 nm, and that it is inappropriate to call a state with a BMD concentration higher than $10^3$ cm$^{-3}$ "non-defective"; that is, such a wafer adversely affects the characteristics of devices formed thereon.

A description will now be made of Examples 1–5 according to this embodiment and Comparative Examples 1–4. Wafers used in Examples 1–5 and Comparative Examples 1–4 are ones that were cut out of silicon ingots produced by the Czochralski method and subjected to ordinary mirror-polishing. The wafers were of the N-type, and had surface orientation of (100) and a resistivity of 1–1,000 Ω·cm. The initial interstitial oxygen concentration $O_i$ was 1.4–1.74× $10^{18}$ atoms/cm$^3$. A vertical heat treatment furnace was used in which the heat insulation was improved and the amount of heat generated by a heating source was increased.

EXAMPLE 1

Among the above-mentioned wafers, wafers having a concentration $O_i$ of $1.7 \times 10^{18}$ atoms/cm$^3$ were subjected to a heat treatment (holding step) of 1,200° C. and 1 hour in a 100% hydrogen atmosphere. The temperature increase rate was set at 30° C./min between 700° C. and 900° C. and at 10° C./min between 900° C. and 1,200° C. The temperature decrease rate was set at 3° C./min.

EXAMPLE 2

Wafers having $O_i$ of $1.61 \times 10^{18}$ atoms/cm$^3$ were subjected to heat treatments in the same manner as in Example 1.

EXAMPLE 3

Wafers having $O_i$ of $1.51 \times 10^{18}$ atoms/cm$^3$ were subjected to heat treatments in the same manner as in Example 1.

EXAMPLE 4

Heat treatments were conducted under the same conditions as in Example 1 except that the temperature increase rate was set at 20° C./min between 700° C. and 1,000° C. and at 10° C. between 1,000° C. and 1,200° C.

EXAMPLE 5

Wafers having $O_i$ of $1.43 \times 10^{18}$ atoms/cm$^3$ were subjected to heat treatments in the same manner as in Example 1.

COMPARATIVE EXAMPLE 1

Among the above-mentioned wafers, wafers having a concentration $O_i$ of $1.7 \times 10^{18}$ atoms/cm$^3$ were subjected to a heat treatment (holding step) of 1,200° C. and 1 hour in a 100% hydrogen atmosphere. The temperature increase rate was set at 10° C./min both between 700° C. and 1,000° C. and between 1,000° C. and 1,200° C. The temperature decrease rate was set at 3° C./min.

COMPARATIVE EXAMPLE 2

Wafers having $O_i$ of $1.61 \times 10^{18}$ atoms/cm$^3$ were subjected to heat treatments in the same manner as in Comparative Example 1.

COMPARATIVE EXAMPLE 3

Wafers having $O_i$ of $1.51 \times 10^{18}$ atoms/cm$^3$ were subjected to heat treatments in the same manner as in Comparative Example 1.

COMPARATIVE EXAMPLE 4

Wafers having $O_i$ of $1.43 \times 10^{18}$ atoms/cm$^3$ were subjected to heat treatments in the same manner as in Comparative Example 1.

The concentration of BMDs occurring in the respective wafer ((110) cross-section) that had been subjected to the heat treatments of Examples 1–5 and Comparative Examples of 1–4 was measured by infrared tomography. The minimum detectable BMD size of the infrared tomography method employed was 20 nm. The detection limit of the BMD concentration depends on measurement regions. In the measurements concerned, the measurement region was a rectangular parallelepiped region which includes a wafer surface area of 4 μm×200 μm and has a depth of 185 μm. In this case, the detection limit of the BMD concentration was $6.8 \times 10^6$ cm$^{-3}$. Under these conditions, the thickness of a DZ layer as defined in the invention (a layer in which the concentration of BMDs not smaller than 20 nm is not more than $10^3$ cm$^{-3}$) corresponds to a depth at which a BMD is first detected in a classical field of view when the detection is started from the surface.

Measurement results and heat treatment conditions are shown in Tables 8 and 9. FIG. 6 is a graph showing a relationship between the initial oxygen concentration and the BMD concentration. The "DZ layer thickness" in the tables means a depth at which a BMD not smaller than 20 nm is first detected when the detection is started from the wafer surface (A DZ layer does not contain a BMD that is not smaller than 20 nm).

As seen from Tables 8 and 9 and FIG. 6, this embodiment can form a good DZ layer even with wafers in which the initial oxygen concentration $O_i$ is high. Further, the BMD concentration in a bulk portion can be reduced.

That is, this embodiment can form a DZ layer (non-defect layer) which is not thinner than 10 μm (as measured from the wafer surface) and in which the concentration of BMDs not smaller than 20 nm in diameter is not more than $10^3$ cm$^{-3}$, and a bulk portion having an oxygen deposit concentration of $1 \times 10^3$ cm$^{-3}$ to $\exp(9.21 \times 10^{-18} \times O_i + 3.224)$ cm$^{-3}$.

Thus, according to this embodiment, a layer to become device active layers can be rendered non-defective and the concentration of BMDs in the vicinity of such a layer can be reduced, so that it becomes possible to produce devices having superior characteristics at a high yield.

In contrast, in the wafers of Comparative Examples 1–4 which were subjected to the heat treatments under the conditions that are out of the ranges of the embodiment, the BMD concentration is higher for a higher initial oxygen concentration. Although a DZ layer is formed even in Comparative Examples 1–4, BMDs are formed in the inside of a wafer at a high concentration, which means that a large number of BMDs exist in the vicinity of a DZ layer. A large number of BMDs existing in the vicinity of a wafer surface layer to become device active layers will probably deteriorate the device characteristics. In addition, the mechanical strength of a wafer is lowered.

TABLE 8

| | Ex. 1 | Ex. 2 | Ex. 3 | Ex. 4 | Ex. 5 |
|---|---|---|---|---|---|
| Marking in FIG. 6 | ○ | ○ | ○ | ○ | ○ |
| $O_i$ (×10$^{18}$ atoms/cm$^3$) | 1.70 | 1.61 | 1.51 | 1.70 | 1.43 |
| Atmosphere | 100% hydrogen gas | | | | |
| Processing temp. | 1,200° C. | | | | |

TABLE 8-continued

| | Ex. 1 | Ex. 2 | Ex. 3 | Ex. 4 | Ex. 5 |
|---|---|---|---|---|---|
| Processing period | 1 hour | | | | |
| Increase rate (°C./min) | 30 | 30 | 30 | 20 | 30 |
| Decrease rate (°C./min) | 3 | 3 | 3 | 3 | 3 |
| DZ layer thickness (μm) | 80 | 90 | 130 | 70 | 150 |
| Bulk BMD concentration (×10$^7$ cm$^{-3}$) | 1.7 | 1.7 | 1.7 | 1.7 | 1.3 |

TABLE 9

| | Comp. Ex. 1 | Comp. Ex. 2 | Comp. Ex. 3 | Comp. Ex.4 |
|---|---|---|---|---|
| Marking in FIG. 6 | ● | ● | ● | ● |
| $O_i$ (×10$^{18}$ atoms/cm$^3$) | 1.70 | 1.61 | 1.51 | 1.43 |
| Atmosphere | 100% hydrogen gas | | | |
| Processing temp. | 1,200° C. | | | |
| Processing period | 1 hour | | | |
| Increase rate (°C./min) | 10 | 10 | 10 | 10 |
| Decrease rate (°C./min) | 3 | 3 | 3 | 3 |
| DZ layer thickness (μm) | 10 | 10 | 10 | 15 |
| Bulk BMD concentration (×10$^7$ cm$^{-3}$) | 170 | 120 | 75 | 50 |

According to this embodiment, even with a wafer having a high initial oxygen concentration, a good non-defect surface layer can be formed and the BMD concentration in a bulk portion can be made low. Therefore, it becomes possible to produce high-quality silicon wafers for highly integrated devices at a high yield.

Further, by using silicon wafers produced according to this embodiment, highly integrated devices having superior characteristics can be produced at a high yield.

What is claimed is:

1. A method of manufacturing a silicon wafer, comprising the steps of:
    initiating a heat history of a wafer produced from a single crystal silicon ingot, the heat history being a heat treatment in which the wafer is heated in an atmosphere including at least one of hydrogen, helium, and argon, while a wafer temperature is increased in a range of 700°–1000° C., at a rate not lower than 15° C./min to thereby control a concentration of ultra-small oxygen deposits; and
    controlling the growth of re-deposition nuclei.

2. The manufacturing method according to claim 1, wherein the step of causing the deposition nuclei to grow is a heat treatment step which is performed in an atmosphere including at least one of hydrogen, helium, and argon and in which the wafer temperature is kept constant in a range of 850° C. to 980° C. for 0.5 to 60 minutes.

3. The manufacturing method according to claim 1, wherein the wafer produced from the single crystal silicon ingot has an interstitial oxygen concentration of 1.2–1.8× 10$^{18}$ atoms/cm$^3$.

4. The manufacturing method according to claim 1, further comprising after the step of causing the deposition nuclei to grow:
    a heat treatment step in which the wafer is heated in an atmosphere including at least one of hydrogen, helium, and argon while the wafer temperature is increased in a range of 1,000° C. to 1,300° C. at a rate of 0.5° to 5° C./min; and
    a heat treatment step which is performed in an atmosphere including at least one of hydrogen, helium, and argon and in which the wafer temperature is kept constant in a range of 1,100° C. and 1,300° C. for not less than 5 minutes.

whereby a surface of the wafer is formed with a non-defect layer in which a concentration of oxygen deposits larger than 20 nm in diameter is not more than $10^3$ cm$^{-3}$.

5. A method of manufacturing a silicon wafer, comprising the steps of:

placing a wafer produced from a single crystal silicon ingot into a furnace;

increasing a wafer temperature in a range of 800° C. to 1,000° C. at a first rate of 15° to 1,000° C./min; and increasing the wafer temperature in a range of 1,000° C. to 1,300° C. at a second rate lower than said first rate and in the range of 0.5°–1° C./min; and keeping the wafer temperature constant in a range of 1,100° C. to 1,300° C. for not less than 5 minutes.

6. The manufacturing method according to claim 5, wherein the second rate is 1°–5° C./min.

7. The manufacturing method according to claim 5, wherein the wafer temperature increasing steps and the wafer temperature keeping step are performed in an atmosphere including at least one of hydrogen, helium, and argon.

8. A method of manufacturing a silicon wafer, comprising the steps of:

preparing a silicon wafer having an interstitial oxygen concentration of $1.4–1.8 \times 10^{18}$ atoms/cm$^3$;

placing the silicon wafer in a furnace;

filling the furnace with an atmosphere including at least one of hydrogen and an inert gas;

increasing a wafer temperature at a first rate of 15° to 100° C./min in a range of a room temperature to 900° C. and at a second rate lower than said first raten, said second rate being 1° to 15° C./min in a range of 900° C. to a holding temperature; and keeping the wafer temperature at the holding temperature that is in a range of 1,100° C. to 1,300° C. for 1 minute to 48 hours.

9. The manufacturing method according to claim 8, wherein the first rate is 20° to 100° C./min.

10. The manufacturing method according to claim 8, wherein the first rate is 30° to 100° C./min.

11. The manufacturing method according to claim 8, wherein the second rate is 5° to 10° C./min.

* * * * *

UNITED STATES PATENT AND TRADEMARK OFFICE
CERTIFICATE OF CORRECTION

PATENT NO. : 5,788,763
DATED : August 4, 1998
INVENTOR(S) : HAYASHI et al.

It is certified that error appears in the above-identified patent and that said Letters Patent is hereby corrected as shown below:

Claim 5, column 19, line 14, "0.5–1°" should read --0.5–10°--.

Claim 8, column 20, line 10, "raten" should read --rate--.

Signed and Sealed this

Nineteenth Day of October, 1999

Attest:

Attesting Officer

Q. TODD DICKINSON

Acting Commissioner of Patents and Trademarks